United States Patent [19]

Batson et al.

[11] Patent Number: 4,755,960

[45] Date of Patent: Jul. 5, 1988

[54] WAVEFORM DATA COMPRESSING CIRCUIT

[75] Inventors: Brian E. Batson, Lake Oswego; Gary R. Fladstol, Portland, both of Oreg.

[73] Assignee: Tektronix, Inc., Beaverton, Oreg.

[21] Appl. No.: 746,898

[22] Filed: Jun. 20, 1985

[51] Int. Cl.<sup>4</sup> ............................ G06F 7/08; G06F 7/02
[52] U.S. Cl. .................................... 364/715; 340/146.2
[58] Field of Search ............... 364/715, 200 MS File, 364/900 MS File; 340/146.2; 377/49

[56] References Cited

U.S. PATENT DOCUMENTS

| | | | |
|---|---|---|---|
| 3,845,465 | 10/1974 | Hosick et al. | 340/146.2 |
| 3,927,309 | 12/1975 | Fujiwara et al. | 364/487 |
| 4,183,087 | 1/1980 | Huelsman | 364/487 |
| 4,499,548 | 2/1985 | Beebe | 328/151 |

FOREIGN PATENT DOCUMENTS

| | | | |
|---|---|---|---|
| 0112982 | 7/1984 | European Pat. Off. | 364/715 |
| 0230529 | 3/1969 | U.S.S.R. | 364/715 |
| 0378868 | 4/1973 | U.S.S.R. | 364/715 |
| 0686027 | 9/1979 | U.S.S.R. | 364/715 |
| 1107118 | 8/1984 | U.S.S.R. | 364/715 |

OTHER PUBLICATIONS

Murthy, "Digital Extremum Calculator", *Wireless World*, vol. 84, #1515, p. 76, Nov. 1978.

*Primary Examiner*—Gary V. Harkcom
*Assistant Examiner*—Dale M. Shaw
*Attorney, Agent, or Firm*—John P. Dellett; Daniel J. Bedell; George T. Noe

[57] ABSTRACT

A data compression circuit has a compression mode of operation where it determines and stores minimum and maximum values of successive sequences of applied data words and provides an output comprising a pair of data words representing the stored minimum and maximum for each sequence, offset by a selected amount. The circuit also has a transparent mode of operation where output data sequences match input data sequences.

7 Claims, 6 Drawing Sheets

WAVEFORM DATA COMPRESSING CIRCUIT

BACKGROUND OF THE INVENTION

The present invention relates in general to data compression circuits and in particular to a method and apparatus for reducing sequences of data characterizing sampled waveform magnitudes to data pairs indicating the minimum and maximum data in each sequence.

A digital sampling oscilloscope measures the magnitude of a voltage waveform at regular intervals, converts the analog sample voltages to digital data, and then uses the digital data to control a display of the waveform on a screen. Typically such an oscilloscope is capable of displaying a fixed maximum number of sample data points along a portion of the waveform. To increase the portion of the waveform displayed (i.e. "compress" the waveform), the sampling rate is reduced. This results in a loss of waveform display detail since high frequency, high magnitude oscillations between sampling points will be overlooked.

What would be useful would be a method and apparatus for compressing a waveform image without decreasing the sampling rate and without decreasing the ability to detect and indicate high frequency, high magnitude voltage swings.

SUMMARY OF THE INVENTION

According to a first aspect of the invention, a waveform data compression circuit converts waveform sample data obtained during a series of waveform sampling intervals to a series of data pairs indicating the minimum and maximum magnitudes of the waveform sample data measured during each sampling interval. If these data pairs are then provided as input data to a vertical raster scan display system similar to the system described in copending U.S. Pat. application Ser. No. 07/102,802, filed Sept. 21, 1987, which is a continuation of U.S. Pat. application Ser. No. 06/746, 815, now abandoned by Bowne and Larson entitled "Vertical Raster Scan Controller", the waveform may be displayed on a screen as a series of vertical bars, one bar corresponding to each waveform sampling period. The vertical positions of the top and bottom of each bar are determined by the value of the maximum and minimum data pairs generated by the compression circuit. The portion of the waveform displayed on the screen may then be expanded by increasing the number of sample points included in a sampling interval without necessarily decreasing the sampling rate. With a suitably high sampling rate, any large voltage swings between the beginning and end of a sampling period would affect the length of the corresponding vertical display line.

According to a second aspect of the invention, the waveform data compression circuit may selectively generate as the minimum sample data of the pair, either the smallest data obtained during a sampling interval or the maximum value outputted during the preceding sampling interval, whichever is smaller. The compression circuit may also selectively output as the maximum value of the pair either the largest data obtained during the sampling interval or the minimum value obtained during the preceding sampling interval, whichever is larger. When such "vectorized" minimum/maximum data pairs are provided as input to a vertical raster scan display system, there is at least one point of overlap between successive vertical bars of the waveform display, thereby yielding the smoothest possible waveform image.

According to a third aspect of the invention, the waveform data compression circuit increases or decreases the minimum and maximum data pairs by a selected offset amount. This feature is useful when the circuit is used in conjunction with a vertical raster scan display system because it permits vertical shifting of a waveform image display.

According to a fourth aspect of the invention, the waveform data compression circuit may be used in conjunction with a digitizer which generates over or under range indicating codes when a sampled waveform is outside selected limits. In such case the maximum or minimum waveform compressor output data comprises these codes. Thus when the waveform data compressor circuit provides waveform sample data input to a vertical raster scan display system, the system can recognize the over and under range conditions and appropriately suppress or clip the waveform display.

According to a fifth aspect of the invention, the waveform data compression circuit may be set to selectively pass data sequences through without compression or offset. When the circuit is used to provide input to a vertical raster scan display system, this feature permits control and graphics data to be sent to the system over the same input channels as waveform sample data.

In a preferred embodiment of the invention, from 1 to 255 sixteen bit data words may be mapped into a single data pair at the rate of $2 \times 10^6$ data words per second, transmitting data pairs to a display system at up to 400,000 words per second with an offset selectable from $+2^{15}$ to $-2^{15}$.

It is therefore an object of the present invention to provide a new and improved method and apparatus mapping a series of a selected number of acquired data words into a pair of data words representing the minimum and maximum data words of the series.

It is another object of the present invention to provide a new and improved method and apparatus providing rapid compression, vectorization and offset of waveform sample data suitable for use by a digital display system.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

DETAILED DESCRIPTION

Figure 1:
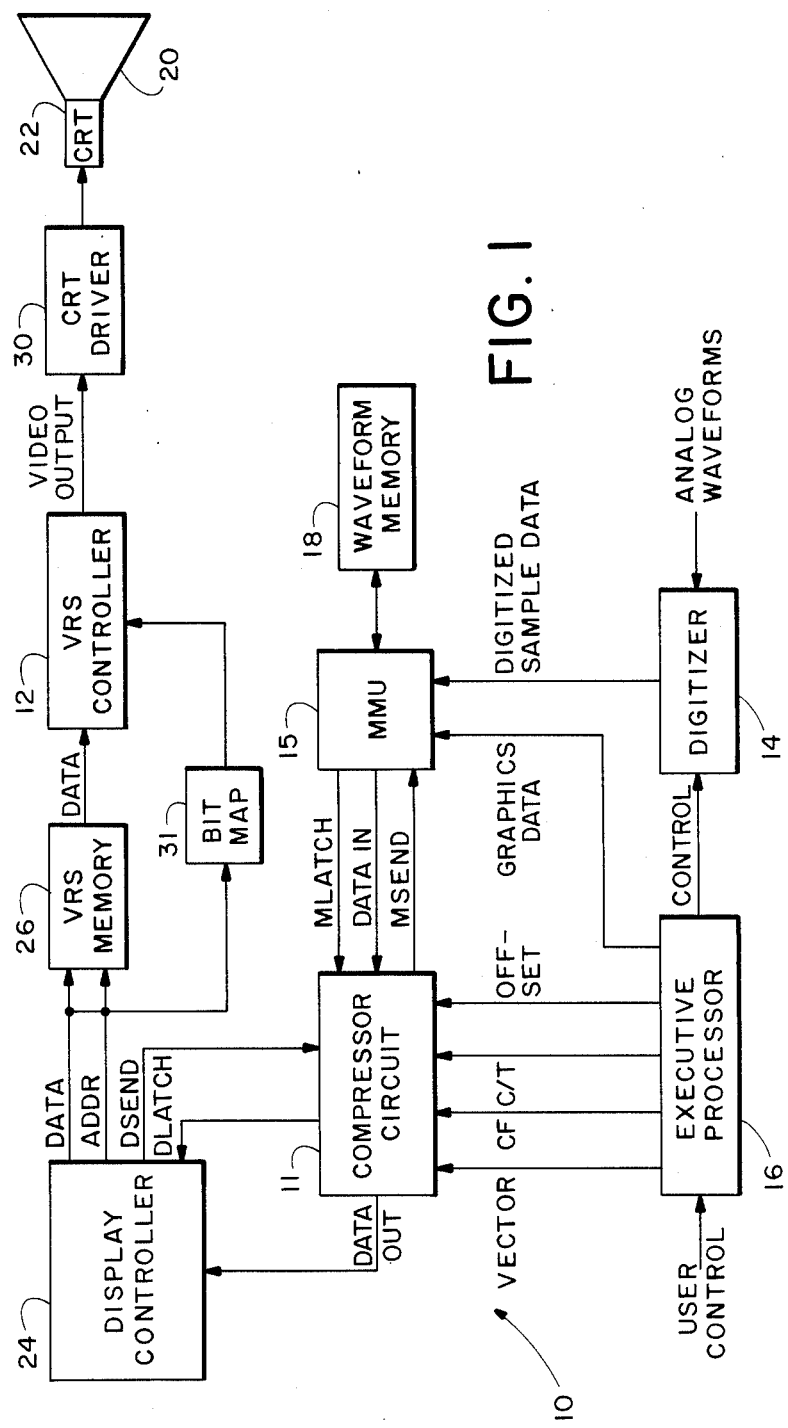
FIG. 1 is a block diagram of a sampling oscilloscope system employing a waveform compressor circuit acccrding to the present invention.

Referring to FIG. 1, there is depicted in block diagram form, an oscilloscope system 10 employing a data compressor circuit 11 according to the present invention adapted to permit digitized waveforms to be displayed on screen 20 of a vertically scanned cathode ray tube (CRT) 22. A digitizer 14 samples and digitizes an analog voltage waveform at regular intervals and transmits digitized waveform data obtained to a memory management unit 15 which stores the sample data in a random access waveform memory 18.

Figure 2:
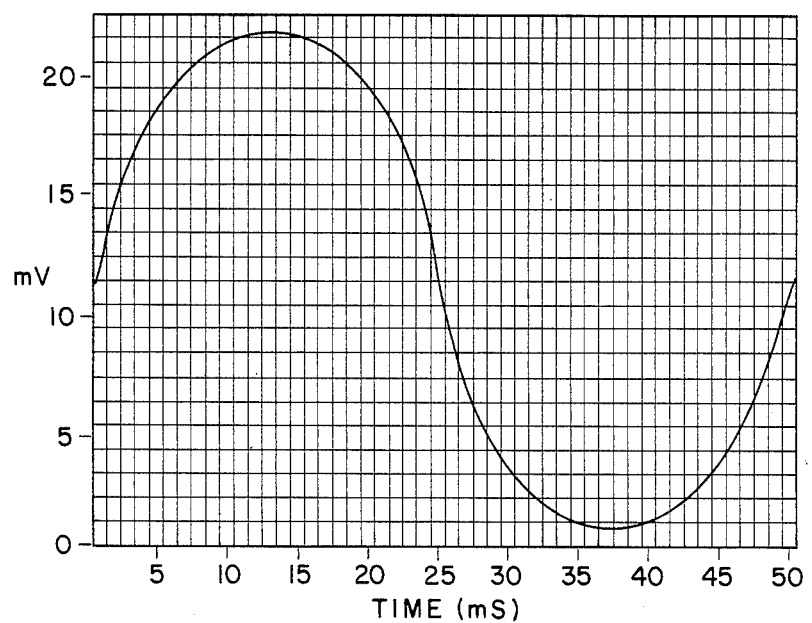
FIG. 2 is an illustration of a typical waveform to be sampled by the oscilloscope system of FIG. 1.

A typical sampled waveform is depicted in FIG. 2. The voltage of the waveform is scaled along the vertical axis while time is scaled along the horizontal axis. Vertical grid lines bound sampling intervals while horizontal grid lines represent measurable voltages. For purposes of illustration, the digitizer 14 is assumed to have a measurement resolution of 1 mV and a sampling interval of 1 mS although other resolutions and sampling intervals may be used. The waveform may be sampled several times during each sampling interval. In the instant case, the digitizer output data at, for instance the beginning of sampling interval 1, indicates that the magnitude of the waveform is 11 mV, while the digitizer output data at the beginning of sampling interval 2 would be 13 mV.

Figure 3A:
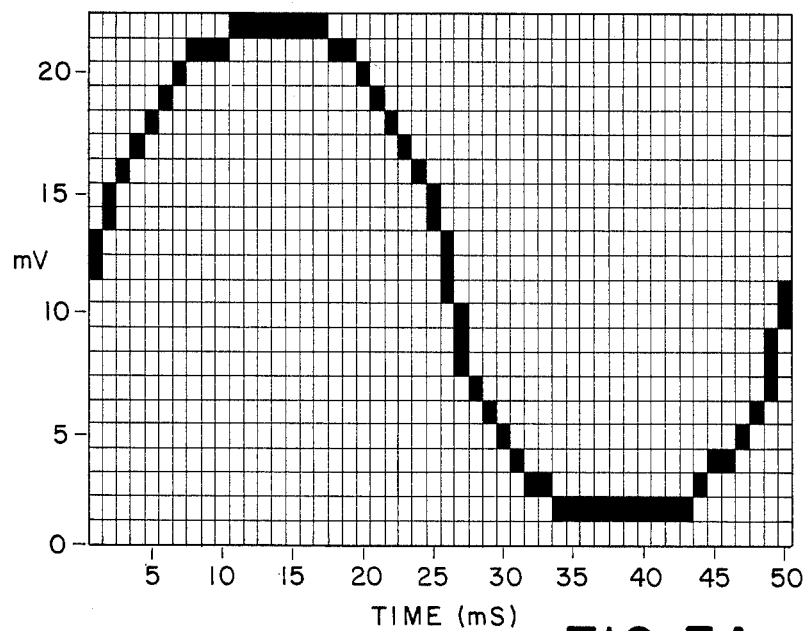
FIG. 3A is an illustration of an image of the waveform of FIG. 2 as displayed by the oscilloscope system of FIG. 1.

An image of the sampled waveform of FIG. 2 is displayed as being displayed on a cathode ray tube (CRT) 22 screen 20 of FIG. 1. A portion of the screen is illustrated in FIG. 3A. The screen is divided into rows and columns of pixels, each pixel column corresponding to one sampling interval and each higher pixel row corresponding to a higher waveform magnitude. The CRT is of the vertical raster scan type wherein an electron beam is rapidly scanned in the vertical direction (to provide the raster scan) and more slowly scanned in the horizontal direction (the field scan), so that pixels are scanned one column at a time.

When the beam is at the bottom of a column, it is off and does not illuminate a currently scanned pixel. As the beam scans towards the top of a column it reaches a pixel row corresponding to the smaller of two data words characterizing the waveform magnitude range during the sample interval corresponding to the vertical raster line. At this point the beam is set to illuminate scanned pixels. When the beam reaches the pixel row corresponding to the higher of the two data words, the beam turns the pixels off. When this procedure is repeated for every vertical scan, the resulting image appears as a series of vertical lines as in FIG. 3A.

Referring again to FIG. 1, the scanning rate and resolution of the digitizer 14 is controlled by an executive processor 16 in response to input from a user. Waveform memory 18 stores the sample data output of the digitizer 14. The memory management unit 15 then transfers the data to a compressor circuit 11 of the present invention which determines the minimum and maximum values of the data during any sampling period and then transmits the minimum/maximum data pairs to a display controller 24.

The display controller 24 stores successive minimum/maximum sample data pairs corresponding to successive sampling intervals in a vertical raster scan (VRS) memory 26 prior to a screen 20 refresh operation. During a refresh operation, controller 24 causes the random access VRS memory 26 to transmit a minimum/maximum data pair to a VRS controller 12 prior to each vertical scan. VRS controller 12 generates a VIDEO OUTPUT control signal to a CRT driver 30 which controls the vertical and horizontal scanning of the beam in CRT 22. The VIDEO OUTPUT control signal from the VRS controller 12 tells the CRT driver when to turn on and off the beam during each vertical scan, according to the minimum and maximum values of the data pair associated with the scan.

During a data compression and transfer operation, compressor circuit 11 transmits an MSEND signal to the memory management unit (MMU) 15 each time it is ready to receive data from the MMU 15. Once the MMU has transmitted the data it generates an MLATCH signal to the compressor circuit 11, causing it to store the new data and to begin comparing it to previously transmitted data. If the magnitude of the new data exceeds the magnitude of any previous data during a current sampling interval, the new data is stored in an internal register as the new maximum data for the sample period. If the magnitude of the new data is less than the magnitude of any previous data obtained during a current sample interval, the new data is stored in another register as the new minimum data for the sampling interval.

Compressor circuit 11 includes means to count the number of data points received during a sampling interval. When the number of digitized data points received equals a "compression factor" (CF) limit, set by data previously transmitted to compressor circuit 11 from the executive processor 16 according to user input, the compressor circuit 11 stops requesting more data points from the MMU 15 and retains the current sample period minimum and maximum data in its internal registers until display controller 24 transmits a DSEND signal to the compressor circuit 11, indicating that it is ready to receive a new data pair. The compressor circuit 11 then transmits the data stored in the internal registers as the minimum/maximum data pair for the sampling interval, asserting a DLATCH output signal to the display controller 24 when the data pair has been sent. The compressor circuit 11 then may reset its internal registers and generate an MSEND signal to the MMU 15 to acquire the first data point of the next sampling period.

Figure 3B:
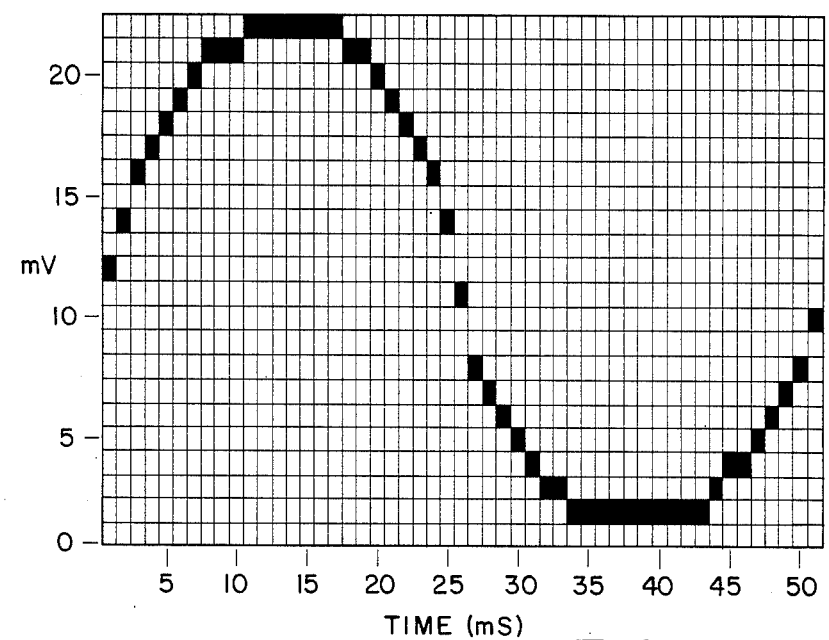
FIG. 3B is an illustration of an non-vectored image of the waveform of FIG. 2.
Figure 3C:
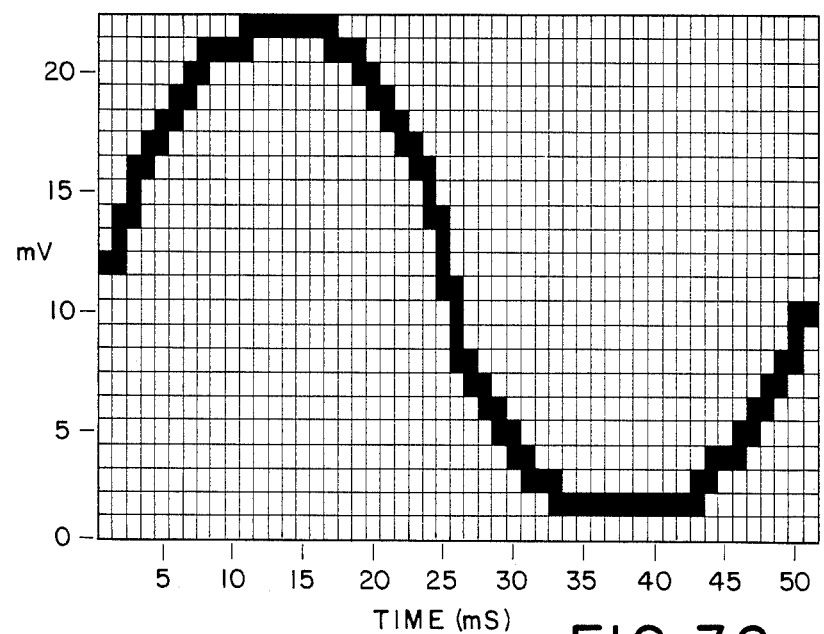
FIG. 3C is an illustration of a vectored image of the waveform of FIG. 2.

When the internal registers are reset after each sampling period, the display on screen 20 may have vertical gaps between successive vertical raster lines in a waveform image if the minimum sample data of one sampling period exceeds the maximum sample data acquired during the preceding sampling period. A gap will also appear in the display if the maximum sample data obtained during a sampling period is less than the minimum sample data obtained during the preceding sampling period. In FIG. 3A a high sampling rate is used and these gaps do not appear. FIG. 3B is an example of how the image of the waveform of FIG. 2A would appear on screen 20 if the digitizer sampled the waveform only once during each interval at the beginning of the interval. The waveform compressor circuit 11 is therefore adapted to eliminate these gaps when a VECTOR signal from the executive processor is asserted. Receipt of a VECTOR signal causes the compressor circuit 11 to retain the maximum value obtained during one sampling period as the first minimum value for the next sampling period and to retain the minimum value obtained during one sampling period as the first maximum value for the next sampling period. This ensures that minimum/maximum data pairs, associated with successive intervals will overlap. FIG. 3C illustrates how the gaps in the image of FIG. 3B would be filled in when compressor circuit 11 is operating in a "vector" mode.

The compressor circuit 11 is also adapted to increase or decrease the magnitudes of the minimum and maximum data by a selected amount prior to transmitting the pair to display controller 24. The amount of the offset is controlled by OFFSET data transmitted to the compressor/offset from the executive controller 16 and stored therein prior to data acquisition. This offset permits a convenient means for controlling the relative vertical position of the waveform image on screen 20.

It may happen that the waveform magnitude is outside the digitizing range of the digitizer 14. If the waveform magnitude is too large in a positive sense, the digitizer generates a special overrange code instead of the digitized waveform data. If the waveform is too large in a negative sense, the digitizer generates a special underrange code. The compressor circuit 11 checks incoming data for underrange and overrange codes and stores these codes as minimums and maximums. If, at the end of a sampling interval, the minimum or maximum sample data stored by the compressor circuit is an overrange or an underrange code, the compressor circuit 11 transmits the overrange or underrange code to the display controller 24 without increasing or decreasing it by the offset amount. The display controller 24 can recognize the overrange and underrange code and generate inhibit bits to be stored in VRS memory 26 which cause VRS controller 28 to appropriately clip the waveform image display in the portions corresponding to the overrange and underrange sections of the waveform.

At the beginning of each waveform data acquisition a unique "null" code is stored in each waveform memory 18 location by the executive controller. As sampling occurs, the stored null codes are replaced by digitizer 14 output data. During a data compression operation, the compressor circuit 11 checks incoming data to determine if it is the null and transfers the null to the display controller 24 as a minimum or a maximum under appropriate conditions. The VRS controller 12 may then suppress display of the raster line associated with a display period if either the minimum or maximum data words is the null code.

A C/T signal is applied to compressor circuit 11 from the executive processor 16. If the C/T signal is not asserted, if the offset data is set to zero, and if the CF data is set to one, the compressor circuit 11 will operate in a "transparent mode" wherein it will pass data from the MMU 15 to the display controller 24 without modification. This feature is particularly useful when the compressor circuit 11 is used in conjunction with an oscilloscope system 10 as in FIG. 1, wherein graphics such as a grid may also be displayed on screen 20 superimposed on the waveform image. The graphical display is bit-mapped by data stored in a conventional bit map circuit 31. The bit map data is transmitted to the VRS controller 12 as the screen is scanned and the VRS controller uses the bit map graphics data in conjunction with waveform data from VRS memory 26 in controlling the VIDEO OUTPUT signal to create the superimposed image. Bit map data is generated by executive processor 16 in response to user input and then transmitted through MMU 15 and compressor circuit 11 (in the transparent mode) to display controller 24. Display controller 24 then transmits the data for storage in bit map 31 at the appropriate address locations.

Figure 4:
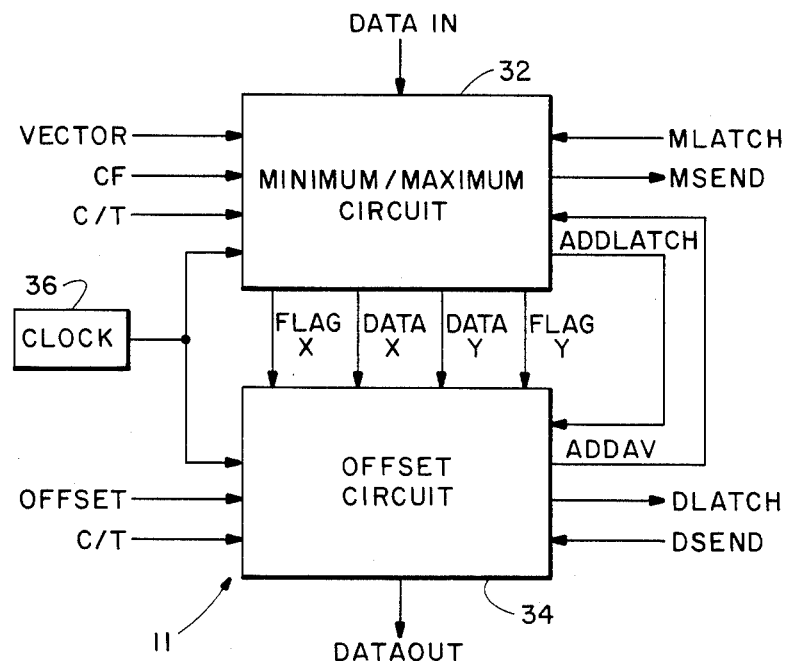
FIG. 4 is a block diagram of the waveform compressor circuit of FIG. 1.

The compressor circuit 11 of FIG. 1, shown in more detail in FIG. 4 in block diagram form, comprises a minimum/maximum (M/M) circuit 32, an offset circuit 34 and a clock pulse generator 36 for generating a clock signal to synchronize the operation of the M/M and offset circuits. The incoming data DATA IN from the MMU 15 is compressed by the circuit 32 to a maximum/minimum data pair, DATA X and DATA Y, and applied to the offset circuit 34. The M/M circuit 32 then asserts an ADDLCH signal to the offset circuit 34 to latch the data pair into registers therein.

The offset circuit 34 adds the appropriate OFFSET value to each member of the data pair and then, on receipt of a DSEND signal from the display controller 24 indicating the controller is ready to accept data, transmits the data sequentially over a DATA OUT bus to the display controller, asserting a DLATCH signal to the display controller to indicate that data has been transmitted and an adder available (ADDAV) signal to the M/M circuit 32 to indicate that it is ready to receive another data pair.

The M/M circuit 32 also generates NULL, OVER, UNDER and C/T bits associated with each word of the minimum/maximum data pair and transmits the indicating bits to the offset circuit 34 with the data pair as four bit FLAG X and FLAG Y words. If the NULL bit is set, indicating that the stored minimum or maximum data is the NULL code, the offset circuit 34 transmits the NULL code to the display controller 24 as the minimum or maximum regardless of the offset value of the data word. If either the OVER or UNDER indicating bit is set, indicating that the associated stored minimum or maximum data comprises over or under range codes, the offset circuit 34 transmits the over or under range code as the minimum or maximum data, regardless of offset value of the data. If the C/T bit is set, the unmodified DATA X word is sent to the display controller, regardless of the state of the other flag bits, while the DATA Y word is ignored.

Figure 5:
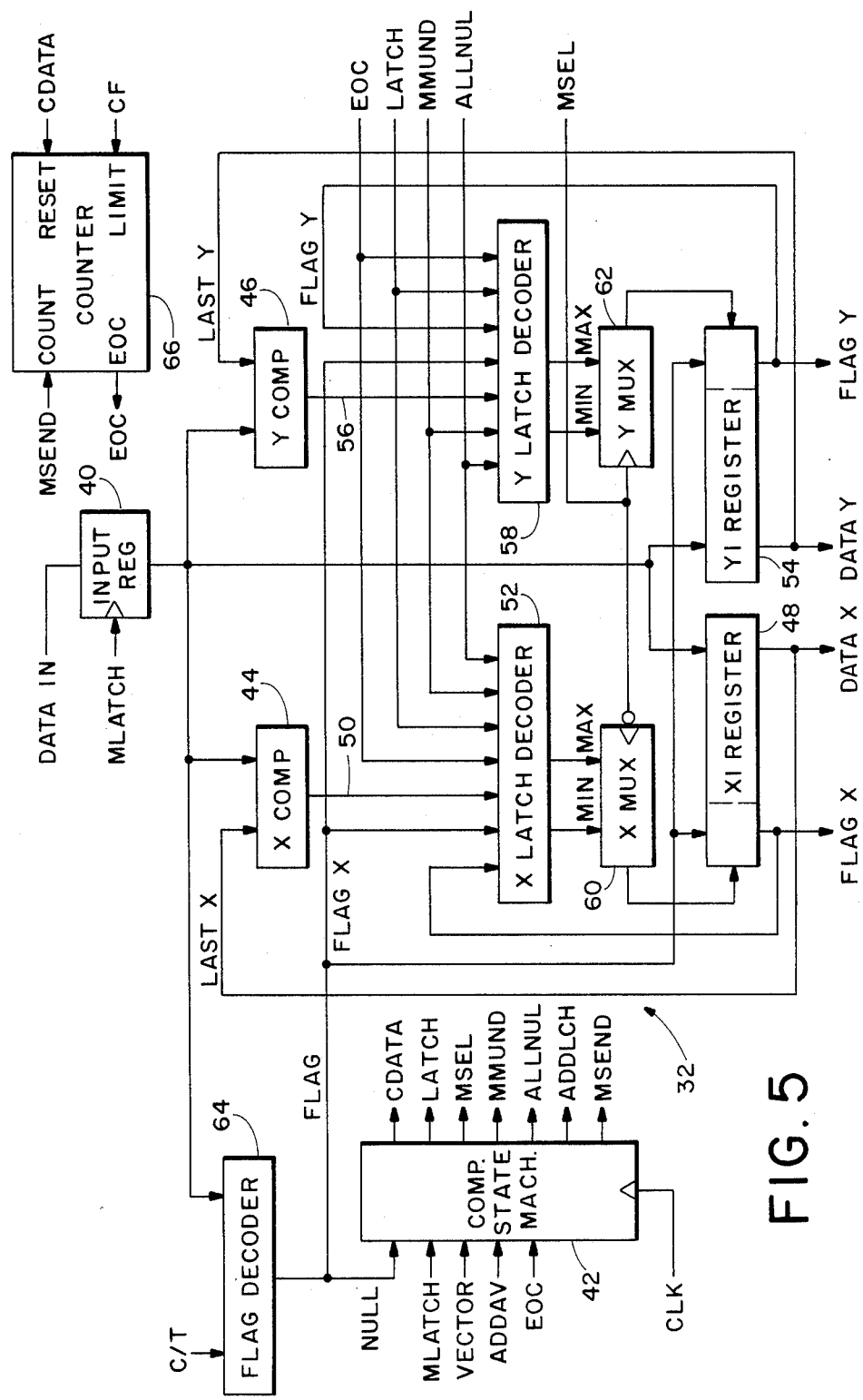
FIG. 5 is a block diagram of the minimum/maximum detection circuit of FIG. 4.

The M/M circuit 32 is depicted in more detailed block diagram form in FIG. 5. The input data is latched into an input register 40 by assertion of the MLATCH signal from the MMU 15. The MLATCH signal is also applied as an input to a compressor state machine 42 which controls the sequencing of the compression circuit 32. The data stored in input register 40 is applied to an X comparator circuit 44 and to a Y comparator circuit 46. If the new data in register 40 exceeds the value of a LAST X data word, previously stored in an X1 register 48, the X comparator 44 asserts an output signal on line 50 connected to an input of an X latch decoder 52. Similarly, if the new data word stored in input register 40 exceeds the value of a LAST Y data word stored in a Y register 54, the Y comparator 46 asserts an output signal on line 56 applied to an input of a Y latch decoder 58.

The X and Y latch decoders 52 and 58 each have two outputs, MIN and MAX. The two outputs of the X latch decoder 52 are applied to two inputs of an X multiplexer 60 while the two outputs of the Y latch decoder are applied to two inputs of a Y multiplexer 62. The output of the X multiplexer 60 is applied to a load control input of X1 register 48 while the output of the Y multiplexer is applied to a load control input of the Y1 register 54. The switching states of the X and Y multiplexers are controlled by an applied MSEL signal from the compressor state machine 42.

The sample data stored in input register 40 is transmitted to the input terminals of both the X1 and Y1 registers 48 and 54 and is stored therein whenever the output signal from the associated X or Y multiplexer 60 or 62 is asserted. If, during current data compression cycle, the MIN output of the X latch decoder 52 controls loading of data into the register X1, then the X register will store the current input data from input register 40 if the input data is less than the LAST X data stored in the X1 register 48. Conversely if the MAX output of X latch decoder 52 controls the X1 register loading, then the new sample data in register 40 will be stored in the X1 register if it is larger than the currently stored LAST X data. Thus the data stored in X1 register 48 may represent either the maximum or the minimum sample data obtained during the current compression cycle depending on the switching state of multiplexer 60. Latch decoder 58 operates in a similar fashion so the LAST Y data stored in Y register 54 may also represent either the maximum or the minimum sample data obtained during the current compression cycle, depending on the switching state of Y multiplexer 62. The states of X multiplexer 60 and Y multiplexer 62 are oppositely switched so that if LAST X is the minimum, then LAST Y is the maximum, and vice versa.

The state machine switches the state of the MSEL control signal after each data compression cycle, corresponding to one sampling interval. Since the MSEL signal changes state after each data compression period, the states of the X and Y multiplexers also change so that during one compression cycle the MIN output of the X latch decoder controls the loading of data into the register X1 while the MAX output of the Y latch decoder controls the loading of data into the register Y1, and during a next data compression cycle, the MAX output of the X latch decoder controls the loading of data into the register X1 while the MIN output of the Y latch decoder controls the loading of data into the register Y1.

When the VECTOR signal is not asserted, state machine 42 asserts an MMUND signal, applied to inputs of decoders 52 and 58, when the first data of a sampling interval is stored in register 40. The asserted MMUND signal causes both the decoders to output the appropriate minimum or maximum signal so that the associated X1 and Y1 registers store the first data of the sequence regardless of the value of the last data stored therein. The compressor circuit thus operates in the "non-vector" mode. If the VECTOR signal is asserted, state machine 42 does not assert the MMUND signal at the start of each compression cycle and the first data word is not automatically stored in the X1 and Y1 registers. Thus during the each compression cycle, the new data must be less than the maximum of the Previous conpression cycle in order to be stored as a new minimum, and must be larger than the previous minimum to be stored as the new maximum, thereby eliminating the possibility of gaps between successive minimum/maximum data pairs by ensuring one point of overlap.

The number of sample data points to be included in a compression cycle is determined by the compression factor CF data from the executive processor 16 applied to an input of a counter 66 of FIG. 5. Counter 66 stores the CF data on receipt of a CDATA signal generated by the compressor state machine 42 prior to the start of a compression cycle. When the M/M circuit 32 is ready to receive another data word from the MMU 15, the compressor state machine 42 transmits the MSEND signal to the MMU and also to a count input of the counter 66 so that the counter 66 counts MSEND signals. When the number of MSEND signals, and therefore the number of input data words received, equals the CF count limit, the counter 66 transmits an end of count (EOC) signal to the state machine 42, indicating the end of the compression cycle.

The new sample data stored in input register 40 is also applied to a flag decoder 64 which determines if the new data matches the overrange, underrange, or null codes and generates a FLAG data word comprising the appropriately set OVER, UNDER and NULL bits. The FLAG data word is transmitted to other inputs of the X1 and Y1 registers 48 and 54 where it is stored as a FLAG X or FLAG word Y if the associated new input data word is also stored as the DATA X or DATA Y minimum or maximum word.

The FLAG data word from the flag decoder 64 and the current FLAG X data word stored in X1 register 48 are both applied to additional inputs to X latch decoder 52 along with a LATCH signal, an ALLNUL signal, and the MMUND signal from the compressor state machine 42. The EOC signal from the counter 66 is also applied to the decoder. Similarly, the FLAG data word from the flag decoder 64 and the current FLAG Y data word stored in the Y1 register 54 are both applied to additional inputs of Y latch decoder 58 along with the LATCH, ALLNUL, and MMUND signals from the compressor state machine 42, and the EOC signal from the counter 66.

The state machine 42 generates the LATCH signal after receiving the MLATCH signal from the MMU indicating new data is stored in input register 40. The MIN output of the X latch decoder 52 is asserted when the X latch decoder receives the LATCH signal from the compressor state machine 42, but only under the following input conditions:

(1) the NULL bit of the FLAG word is false, and the OVER bit of the FLAG X word is true;
(2) the NULL bit of the FLAG X word is true;
(3) the UNDER bit of the FLAG word is true;
(4) the UNDER bit of the FLAG X word and the NULL and OVER bits of the FLAG word are false and the output of the X comparator is true;
(5) the EOC bit and ALLNUL bits are true; or
(6) the MMUND signal from the state machine is true.

In case (1) the new data word is stored in X1 register 48 as the new minimum if it is not null and the currently stored minimum word is overrange. It does not matter whether the new data word is overrange, underrange, larger or smaller than the currently stored minimum word in the X1 register. In case (2) the new data words stored as the new minimum if the currently stored minimum word is null. In case (3) the new data word is stored as the minimum if it is underrange. It does not matter if it is less than or greater than the currently stored minimum. In case (4) the new data is stored in the X1 register as a minimum if it is less than the currently stored minimum, and is not null or overrange, as long as the current minimum is not underrange.

The NULL bit of the FLAG word is applied to another input of the compressor state machine 42. As long as all of the data words received during a compression cycle are null, the ALLNUL output signal of the state machine remains high. Therefore, in case (5) the new data is stored in the register X1 as a minimum if it is the last data received during a compression cycle (i.e. EOC is true) and all of the other data words received during the compression cycle were also null (i.e. ALLNUL is true). This ensures that the FLAG X word contains a true NULL bit at the end of the compression cycle.

The state machine 42 continues to assert the MMUND signal until the first data for the first compression cycle has been stored in the X1 and Y1 registers. An asserted MMUND signal at the start of the first compression cycle indicates that the contents of the X1 and Y1 registers are undefined and should be replaced. This feature is necessary in the preferred embodiment because there is no provisions to reset the registers. As indicated hereinabove, when operating in the nonvector mode (i.e. VECTOR is false), the state machine 42 asserts the MMUND signal at the start of every compression cycle in order to prevent automatic data overlap between successive data pairs. Therefore, in case (6) the X1 register stores the new data word as the current minimum if it is the first word of the first compression cycle, regardless of operation mode, and stores the new data word if it is the first data word of any compression cycle if the system is operating in the nonvector mode, thereby insuring that the previously stored data is overwritten.

If the X1 register is storing maximum data, the MAX output of the X latch decoder 52 is asserted, causing the X1 register to store the current data when the X latch decoder receives a LATCH signal from the compressor state machine 42, but only under the following input conditions:

FLAG word is false,
(7) the NULL bit of the and the UNDER bit of the FLAG X word is true;
(8) the NULL bit of the FLAG X word is true;
(9) the OVER bit of the FLAG word is true;
(10) the OVER bit of the FLAG X word and the NULL and UNDER bits of the FLAG word are false and the output of the X comparator is false;
(11) the EOC bit and ALLNUL bits are true; or
(12) the MMUND signal from the state machine is true.

In case (7) the new data word is stored as a maximum if it is not null and the current maximum word is underrange. In case (8) the new data word is stored as the new maximum if the currently stored maximum word is null. In case (9) the new data word is stored as the current maximum for the compression cycle if it is overrange. In case (10) the new data is stored in the X1 register as the maximum if it is greater than the currently stored maximum and is not null or underrange, provided that the currently stored maximum is not overrange. In case (11) the new data is stored in the X1 register as the maximum if it is the last data received during a compression cycle and the all of the other data words of the cycle were null. Finally, in case (12) the new data word is stored in the X1 register if it is the first data received during the first compression cycle of a sampling operation, or when the compressor 11 is operating in a nonvector mode, if the new data word is the first data received during any compression cycle.

The MIN and MAX outputs of the Y latch decoder 58 behave in a similar fashion to the MIN and MAX outputs of the X latch decoder 52 as described hereinabove with the substitution of the FLAG Y indicator bits and the Y comparator output for the FLAG X indicator bits and X comparator output.

In the preferred embodiment of the present invention, each X and Y latch decoder is suitably implemented using a read only memory addressed by the decoder inputs, the output MIN and MAX signals being controlled by two data bits stored at each ROM address. The stored ROM data is selected to achieve the appropriate input/output characteristics when read enabled by the LATCH signal.

Figure 6:
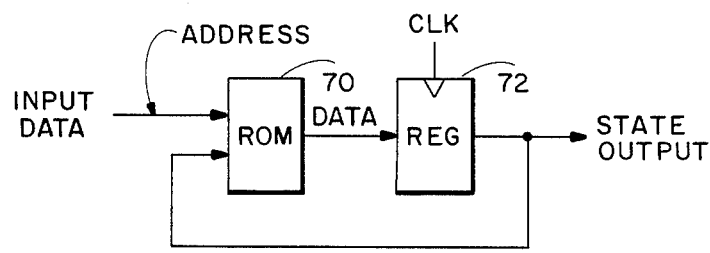
FIG. 6 is a block diagram of the state machine of FIGS. 5 and 7.

State machine 42, detailed in block diagram form in FIG. 6, comprises a read only memory 70 addressed in part by the input data, and a register 72 for storing currently addressed read only memory data when a clock input of the register is strobed. The data stored in the register 72 is reapplied to the ROM 70 address input terminals as the remaining portion of the ROM 70 address. Each bit of the data stored in register 72 comprises one of the state machine output signals. The data stored at the various addresses in ROM 70 is such that the current ROM 70 output data is appropriate for a given combination of current input data and current state data.

Figure 7:
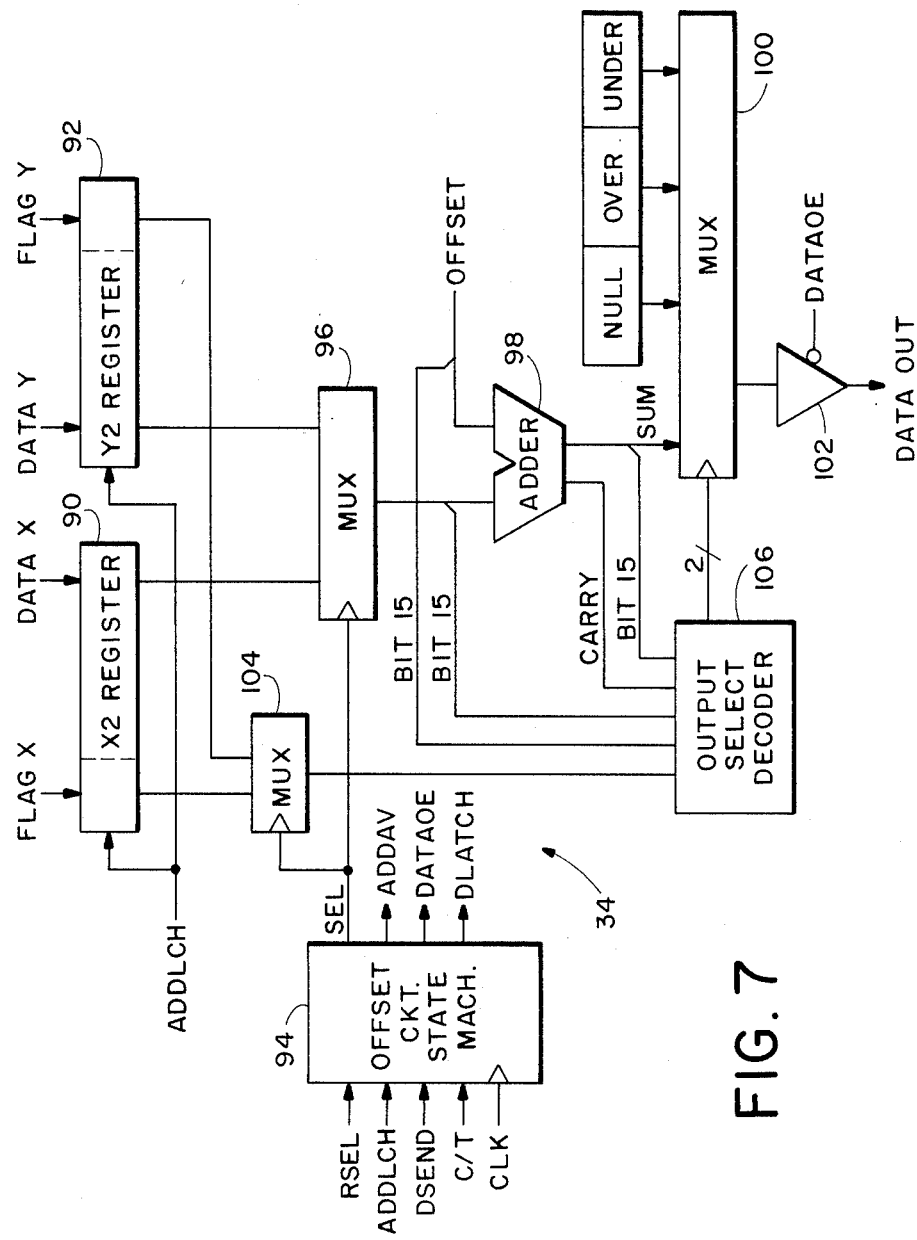
FIG. 7 is a block diagram of the offset circuit of FIG. 4.

The offset circuit 34 of FIG. 4, depicted in block diagram form in FIG. 7, comprises an X2 register 90 for storing the FLAG X and DATA X words and a Y2 register 92 for storing the FLAG Y and DATA Y words from the M/M circuit 32 of FIG. 4. The ADDLCH signal from M/M circuit 32 is applied to the storage control terminals of both registers and also to an input of an offset circuit state machine 94 similar in topology to the state machine 42 of M/M circuit 32 as shown in FIG. 6. The DATA X data stored in register X2 is applied to one input of a multiplexer 96 while the DATA Y data stored in the Y2 register is applied to another input of the multiplexer. The output of multiplexer 96 is connected to one input of an adder 98 while the OFFSET data from the executive processor 16 of FIG. 1 is applied to another input of the adder. The adder 98 sums the output of multiplexer 96 and the OFFSET data and transmits the result to an input of another multiplexer 100.

After the M/M circuit 32 sends an ADDLCH signal to the offset circuit state machine 94, the state machine transmits a SEL output signal to the switch control input of multiplexer 96 switching the multiplexer to a state wherein the DATA X word stored in X2 register 90 is passed to the adder 98. Adder 98 then adds the OFFSET data to the DATA X word and passes the result to multiplexer 100. If the DATA X word is not null, overrange, or underrange, multiplexer 100 passes the offset DATA X word to a buffer 102. The DSEND signal from the display controller 24 is applied to another input of offset state machine 94 and when the signal is asserted, indicating that the display controller is prepared to receive more data, the offset circuit state machine 94 generates a DATAOE signal to output enable the buffer 102. Buffer 102 then transmits the offset DATA X word to the display controller over the DATA OUT bus. Offset state machine 94 then transmits the DLATCH signal to the display controller to indicate data transmission has occurred.

After the offset DATA X word is sent, the state machine 90 changes the state of the SEL output signal to change the switching state of multiplexer 96 so that the multiplexer transmits the DATA Y word from Y2 register 92 to the adder 98. The adder 98 then adds the OFFSET data to the DATA Y word. The sum, if the DATA Y word is not null, overrange or underrange, is then transmitted through multiplexer 100 and buffer 102 to the display processor 24 following the offset state machine's receipt of another DSEND signal from the display processor.

The FLAG X and FLAG Y data stored in the X2 and Y2 registers are applied to separate inputs of another multiplexer 104 and the output of multiplexer 104 is applied to an input of an output select decoder 106. The most significant bit (bit 15) of the adder 98 output, of the OFFSET data, and of the multiplexer 96 sum output are also applied to output select decoder 106 inputs along with a CARRY signal from the adder 98. The CARRY signal indicates when the adder output sum has exceeded the adder capacity.

A set of data codes NULL, OVER, and UNDER, are applied to three other inputs of multiplexer 100 and a two bit output of output select decoder 106 controls the switching state of the multiplexer. The output select encoder 106 controls the switching state of multiplexer 100 as follows:

| MUX 100 OUTPUT | SELECT ENCODER INPUT STATE |
|---|---|
| NULL | DATA X(or Y) is null. |
| OVER | DATA X(or Y) is overrange. |
| OVER | DATA X(or Y) bit 15 is 0, OFFSET bit 15 is 0 and CARRY bit is 1. |
| UNDER | DATA X(or Y) is underrange. |
| UNDER | DATA X(or Y) bit 15 is 0, OFFSET bit 15 is 1 and SUM bit 15 is 1. |
| SUM | All other states. |

The NULL, OVER, and UNDER codes indicate to the display controller 24 that the minimum or maximum data word of the current pair is null, overrange or underrange. When the display processor 26 of FIG. 1 receives data from the compressor circuit 11, it can check to see if it indicates that the minimum or maximum data word is overrange, underminimum range or null and can add appropriate indicating bits to the word prior to storing it in VRS memory 26. VRS controller 12 may then use these indicating bits to determine whether or not to suppress or clip the vertical raster line corresponding to the data.

Referring again to FIG. 5, the C/T signal from the executive processor 16 is applied as another input to flag decoder 64. When the C/T signal is asserted, the compression circuit operates to compress data 65 described hereinabove. However when the C/T signal is not asserted, the X and Y latch decoders 52 and 58 transmit the appropriate MIN or MAX signal to the X and Y multiplexers 60 and 62 to cause the X1 and Y1 registers both to store every data word sent to input register 40 regardless of its value. If the CF data defining the count limit is preset to one, the data stored in X1 and Y1 registers 48 and 54 is passed on to X2 and Y2 registers 90 and 92 of FIG. 7 without compression.

The C/T signal is also applied to state machine 94 of FIG. 7 and when the C/T signal is not asserted, the SEL signal does not change state after each compression cycle so that the magnitude data in X2 register 90 is always passed through MUX 96 and ADDER 98 to MUX 100 and the flag data in X2 register 90 is always passed through MUX 104 to decoder 106, the data in Y2 register 92 being ignored. The flag data applied to decoder 106 includes a bit indicating that C/T is low and causes decoder 106 to maintain multiplexer 100 in a switching state wherein the sum data from adder 98 is passed to buffer 102 regardless of the states of the other FLAG bits. Thus if the OFFSET data is set to zero, the CF data is set to one, and the C/T signal is not asserted, the compressor circuit operates on the transparent mode and graphics or other data from the MMU 15 will pass through the compressor circuit 11 without compression or offset.

It is therefore seen that the waveform compressor circuit 11 of the present invention provides rapid sample data compression for a vertical raster scan display system by determining the minimum and maximum values of sequences of applied data and sequentially outputting a selectively offset minimum and maximum pair to the display system, according to either the vector or non-vector mode of operation. The sequence length is adjustable. Further, if the minimum or maximum is overrange, underrange, or null the corresponding word of the output data pair comprises a special underrange, overrange, or null indicating code. The compressor circuit 11 may also be placed in the transparent mode where data is passed through without modification.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for generating a pair of data words characterizing a sequence being either a magnitude number or said sequence being either a magnitude number or one of a set of codes, said method comprising the steps of:

a. storing a first word of said sequence in a first and a second register;

b. replacing data stored in said first register with a next data word of said sequence if said next data word and said data stored in said first register are both magnitude numbers and said next data word is larger than said data stored in said first register, or if said next data word or said data in said first register are selected ones of said codes;

c. replacing data stored in said second register a next data word of said sequence if said next data word and said data stored in said second register are both magnitude numbers and said next data word is smaller than said data in said first register, of if said next data word or said data in said second register are selected ones of said codes;

d. repeating steps b and c for all data words of said sequence so that following occurrence of said sequence said data stored in said first register comprises either said largest word of said sequence or one of said codes and said data stored in said second register comprises either said smallest word of said sequence or one of said codes.

2. A method for generating a pair of data words characterizing a sequence of data words, each word of said sequence corresponding to a separate event and being either a number representing a magnitude of the event, an overrange code indicating the event magnitude exceeds a selected upper limit, an underrange code indicating the event magnitude is less than a lower limit, or a null code indicating the event has not occurred, said method comprising the steps of:

a. storing a first word of said sequence in first and second registers;
b. replacing data currently stored in said first register word with a next data word under any one of said following conditions:
  b1. said next data word is not said null code and said current first register data word is said underrange code;
  b2. said current first register data word is said null code;
  b3. said next data word is said overrange code;
  b4. said next data word is larger than said current first register data word, said next data word is not said null or the underrange code, and said currently stored first register data is not said overrange code; or
  b5. said next data word is said last data word of said sequence and all of said words of said sequence were said null code;
c. replacing data currently stored in said second register with a next data word under any one of said following conditions:
  c1. said next data word is not said null code and the second register data word is said overrange code;
  c2. said current second register data word is said null code;
  c3. said next data word is said underrange code;
  c4. said next data word is less than said current second register data word, said next data word is not said null or overrange code, and said currently stored data is not said underrange code; or
  c5. said next data word is said last data word of said sequence and all of said words of said sequence were said null code; and
d. repeating steps b and c for all data words of said sequence so that following occurrence of said sequence said data stored in said first register comprises either said largest word of said sequence or one of said overrange, underrange or null codes and said data stored in said second register comprises either said smallest word of said sequence or one of underrange, overrange or null codes.

3. A method as in claim 2 wherein said current first register stored data is also replaced with said next data word in step b under said following condition:
  b6. an applied transparent mode indicating signal is not asserted, said mode indicating signal being asserted when said data pair is to be generated by said apparatus and being not asserted when each word of said sequence is to be successively stored in said first register irrespective of its value and irrespective of the currently stored data in said first register.

4. A method for generating pairs of data words; characterizing a plurality of separate data word sequences, said method comprising the steps of:
  a. generating a selection signal selectively of either a first or a second state;
  b. storing a first word of a first sequence in a first and a second register;
  c. replacing data stored in said first register with a next data sequence word if said next data word is larger than said data stored in said first register and said selection signal is of said first state;
  d. replacing data stored in said second register with a next data word if said next data word is smaller than said data stored in said second register and said selection signal is of said first state;
  e. replacing data stored in said first register with a next data word if said next data word is smaller than said data stored in said first register and said selection signal is of said second state;
  f. replacing data stored in said second register with a next data word if said next data word is larger than said data stored in said second register and said selection signal is of said second state;
  g. repeating steps b through f for all data words of said sequence;
  h. changing said state of said selection signal while maintaining the last stored data words in said first and second registers; and
  i. repeating steps c through h for each of said plurality of said data word sequences.

5. An apparatus for selectively operating in one of data compression mode and a transparent mode by generating a data word pair characterizing maximum and minimum data words of a first sequence of data words when operating in said data compression mode and generating a second data word sequence matching said first sequence when operating in said transparent mode, said apparatus comprising:
  first means for storing data;
  second means for storing data;
  third means for comparing data stored by said first means with each word of said first sequence as it occurs and replacing data stored in said first means with each said first sequence word as it occurs if said first sequence word is greater than said stored data or if an applied transparent mode indicating signal is not asserted; and
  fourth means for comparing data stored by said second means with each word of said first sequence as it occurs and replacing said data stored in said second means with said first sequence word as it occurs if said first sequence word is less than said stored data,
  so that if said applied transparent mode indicating signal is asserted during occurrence of said first sequence, said first means stored data comprises said maximum data word of said first sequence and said second means stored data comprises said minimum word of said first sequence, and
  if said applied transparent mode indicating signal is not asserted during occurrence of said first sequence, said second sequence comprises each word stored in said first means during said first sequence.

6. An apparatus for generating a pair of data words characterizing a sequence of data words, each word of said sequence corresponding to a separate event and being either a number representing a magnitude of the event, an overrange code indicating the event magnitude exceeds a selected upper limit, an underrange code indicating the event magnitude, is less than a selected lower limit, or a null code indicating the event has not occurred, said apparatus comprising:
  means for generating an underrange indicating signal if a next word of said sequence is said underrange code;

means for generating an overrange indicating signal if said next sequence word is said overrange code;

means for generating a null indicating signal if said next sequence word is null code;

first means for storing a minimum data word, coupled to receive and store said next sequence word as said minimum data word on receipt of a first storage indicating signal;

second means for storing a maximum data word, coupled to receive and store said next sequence word as said maximum data word on receipt of a second storage indicating signal;

means for generating a minimum indicating signal if said next sequence word is less than said stored minimum data word;

means for generating a maximum indicating signal if said next sequence word is greater than said stored maximum data word;

first decoding means for transmitting said first storage indicating signal to said first storage means on occurrence of a selected combination of overrange, underrange, null and minimum indicating signals; and second decoding means for transmitting said second storage indicating signal to said second storage means on occurrence of a selected combination of overrange, underrange, null and minimum indicating signals.

7. An apparatus as in claim 6 further comprising:

means for outputting said data word pair, said word pair comprising a first data word and a second data word, said first data word comprising said minimum data word if said minimum data word comprises said overrange code, said underrange code, or said null code, said first data word otherwise comprising a sum of said minimum data word and a selected offset value, and said second data word comprising said maximum data word if said maximum data word comprises said overrange code, said underrange code, or said null code, said second data word otherwise comprising a sum of said maximum data word and a selected offset value.

* * * * *